United States Patent [19]

Male et al.

[11] Patent Number: 5,440,153

[45] Date of Patent: Aug. 8, 1995

[54] ARRAY ARCHITECTURE WITH ENHANCED ROUTING FOR LINEAR ASICS

[75] Inventors: Barry J. Male, Nashua, N.H.; Douglas L. Anneser, Chelmsford, Mass.

[73] Assignee: United Technologies Corporation, Hartford, Conn.

[21] Appl. No.: 222,736

[22] Filed: Apr. 1, 1994

[51] Int. Cl.6 .................... H01L 29/70; H01L 27/102
[52] U.S. Cl. ................................. 257/204; 257/555; 257/205; 257/207; 257/208
[58] Field of Search ............... 257/204, 205, 208, 209, 257/210, 211, 560, 207, 555, 556, 563, 564, 566, 574, 575, 577, 532–535, 536–538

[56] References Cited

U.S. PATENT DOCUMENTS

| | | | |
|---|---|---|---|
| 3,808,475 | 4/1974 | Buelow et al. | 257/204 |
| 4,623,911 | 11/1986 | Pryor | 357/45 |
| 4,644,382 | 2/1987 | Charransol et al. | 357/42 |
| 4,682,202 | 7/1987 | Tanizawa | 257/204 |
| 4,745,084 | 5/1988 | Rowson et al. | 437/51 |
| 4,811,073 | 3/1989 | Kitamura et al. | 357/054394382 |
| 4,816,887 | 3/1989 | Sato | 357/42 |
| 4,851,893 | 7/1989 | Giannella | 257/204 |
| 4,965,651 | 10/1990 | Wagner | 257/206 |
| 4,978,633 | 12/1990 | Seefeldt et al. | 437/51 |
| 4,984,050 | 1/1991 | Kobayashi | 357/41 |
| 5,063,429 | 11/1991 | Crafts | 357/40 |
| 5,072,285 | 12/1991 | Ueda et al. | 257/205 |
| 5,101,258 | 3/1992 | Moriuchi et al. | 257/557 |
| 5,111,271 | 5/1992 | Hatada et al. | 357/45 |

Primary Examiner—William Mintel
Assistant Examiner—Peter Toby Brown
Attorney, Agent, or Firm—Richard H. Kosakowski; Holland & Associates

[57] ABSTRACT

A linear, bipolar-type application-specific integrated circuit includes a silicon substrate having a plurality of columns of device primitives or cells. Each cell comprises a plurality of identical NPN and PNP transistors flanking a centrally-located capacitor. Each transistor has dual emitters, bases and collectors. Open field areas are reserved on the silicon substrate on the sides of the columns of cells. Formed in these open field areas are precise thin film silicon chromium resistors. Power planes are also routed in these open field areas. A ground plane is routed in the vicinity of the centrally-located capacitor. Standard analog circuits are personalized using two layers of metallization interconnects.

19 Claims, 4 Drawing Sheets

ARRAY ARCHITECTURE WITH ENHANCED ROUTING FOR LINEAR ASICS

BACKGROUND OF THE INVENTION

This invention relates to integrated circuits ("ICs"), and more particularly, to a linear, bipolar-type, analog, application-specific integrated circuit ("ASIC") having a continuous column array architecture of complementary bipolar analog device primitives that enhances simple interconnection among and between the primitives and other components.

Control systems in the aircraft industry are used in various aspects, such as gas turbine engine controls, flight controls, advanced avionic data systems and guidance systems. Over time, increased reliability standards and more stringent size and weight limitations have continued to be imposed upon the electronic circuitry that forms the heart of these control systems. Specifically, increases in the number of control loop parameters, redundancy control, flight control navigation functions, and fire control are just some of the common features now being implemented by electronic circuitry within aircraft flight controls.

These increased functions, together with the reduced size requirements, have resulted in greater efforts to reduce the number of electronic components and interconnections. One avenue explored has been the merging of discrete analog circuit functions into ASICs. Traditionally, ASICs have been reserved for strictly digital logic implementations. It has been recognized that the size of an aircraft control system is largely determined by the amount of analog circuitry and not the digital circuitry. As such, a continuous development effort in linear, bipolar-type analog ASICs is required.

It has been known in the past to create full-custom, linear analog ICs. Such full-custom IC design requires hand crafting of the IC design at the silicon transistor level, requiring an all-level mask definition. One problem with the full-custom approach is that it becomes unfeasible when the ASIC component development occurs in conjunction with the new products in which it is used.

In view of these and other problems inherent with the full-custom approach, it is known to use a semi-custom approach to developing linear ICs. Such an approach utilizes an array architecture of analog circuits, such as current mirrors, op-amps, comparators and current sources, fabricated from a large number of interconnected components, such as bipolar PNP and NPN transistors, resistors, capacitors and diodes. The components are electrically connected into the resulting desired circuits by one or more application-specific, customer-defined metal layers.

However, the interconnection of discrete components in a semi-custom linear, array-type ASIC has historically been a relatively long, time-consuming, manual process. This is in contrast to digital ASICs, where component interconnection is usually done by automatic means; that is, through use of computer-aided design ("CAD") systems. Linear ASIC interconnection difficulty in prior-art designs can be attributed to the substrate placement, content and limited number of transistors available in prior art ASIC architectures. Typically, current state-of-the-art linear ASICs use a predetermined number of device primitives, such as bipolar NPN and PNP transistors, together with diodes, capacitors and resistors in a replicated tile structure that is personalized by metal connections for the end circuit application. Usually, a library of pre-defined cells comprising the various components are used to create functional circuit elements, such as voltage references, op-amps and comparators.

However, this type of replicated tile structure limits standard cell size and wastes tile component residue. That is, not all of the transistors and/or the other components on the substrate are utilized when building the functional circuit elements. This problem is inherent in the design of the replicated tile structure. Another inherent problem is that certain circuits have limited physical locations on the semiconductor substrate. Also, tile component orientation and interconnect channel width pose routing difficulty with standard circuit topologies.

Accordingly, it is a primary object of the present invention to provide a linear, bipolar-type ASIC having an array architecture with one or more continuous columns of array cells comprised of device primitives (i.e., transistors) and other components.

It is a general object of the present invention to provide a linear, bipolar-type ASIC having a transistor level array that allows for full personalization of the primitives and other components, thereby allowing considerable design flexibility.

It is a further object of the present invention to provide a linear, bipolar-type ASIC having a continuous column architecture that allows for placement of laser-trimmable, thin film resistors and power/ground planes in and between, or adjacent to, any two columns and between columns and the bond pads disposed around the outer periphery of the ASIC substrate.

It is yet another object of the present invention to provide a linear, bipolar-type ASIC having an array architecture of analog, bipolar complementary NPN and PNP transistors having high-accuracy, high-frequency and high-temperature operation.

It is still another object of the present invention to provide a linear, bipolar-type ASIC with a continuous column architecture fabricated using an advanced, complementary bipolar linear, bonded-wafer SOI process technology.

It is a further object of the present invention to provide a linear, bipolar-type ASIC with an array architecture of transistor primitives that can be personalized for individual, desired circuits through use of automatic means, such as CAD tools.

Another object of the present invention is to provide a linear, bipolar-type ASIC having a continuous column array architecture that allows wide latitude in the arrangement, distribution, spacing and indexed placement of circuits formed from the various components fabricated on the semiconductor substrate.

Still another object of the invention is to provide a linear, bipolar-type ASIC with a continuous column array architecture that has a relative increase in component density over prior-art designs.

The above and other objects and advantages of this invention will become more readily apparent when the following description is read in conjunction with the accompanying drawings.

SUMMARY OF THE INVENTION

To overcome the deficiencies of the prior art and to achieve the objects listed above, the Applicants have invented an ASIC having a continuous column architecture. In the preferred embodiment, the array includes four columns comprised of a plurality of transistor primitives arranged in cells (approximately sixty cells per column) fabricated in a silicon semiconductor substrate and arranged adjacent to one another in a straight line columnar architecture. The major geometrical axis of each cell is perpendicular to the major geometrical axis of each column. The cell columns are located toward the center of the ASIC substrate. Bond pads and associated circuitry are located around the outer periphery of the ASIC substrate. The bond pads connect the substrate to external connection pins on the overall ASIC chip. Disposed between the bond pads and the outermost cell columns, and between the innermost columns are open field areas on the substrate. These open areas facilitate the placement of power planes, and custom, laser-trimmable thin film resistors.

Each cell includes a centrally-located capacitor flanked on one side by a row of three identical bipolar PNP transistors, and flanked on the opposite side by three identical bipolar NPN transistors. Ground planes are routed in proximity to the capacitors. Each PNP and NPN transistor has two emitters, two bases and two collectors. Each cell is "personalized" to achieve a specific circuit function, such as a current mirror, by connecting one or more of the transistors, capacitors and thin film resistors in the appropriate circuit configuration through use of double-level metallizations, vias and contacts. The cells are also connected to each other, to the power and ground planes, and to bond pads for external connections to the ASIC by use of the same double-level metallizations, vias and contacts. None of the double-level metallizations cross over any of the transistors.

The present invention has utility in that the columnar array architecture and open field areas allow enough physical space to be able to route connections for all of the components on the substrate. This has the beneficial result of being able 5 to use all of the transistors within the various types of circuits, in contrast to the aforedescribed prior art replicated tile structure in which not all of the transistors can be connected due to the inherent design. Further, the resulting connections can be made in the array architecture using CAD tools, which further allows the routing to be made on a "coarse" grid, instead of a submicron-type grid. This has special benefits, including more accurate and efficient routing of connections.

DETAILED DESCRIPTION OF THE PREFERRED EMBODIMENTS

Figure 1:
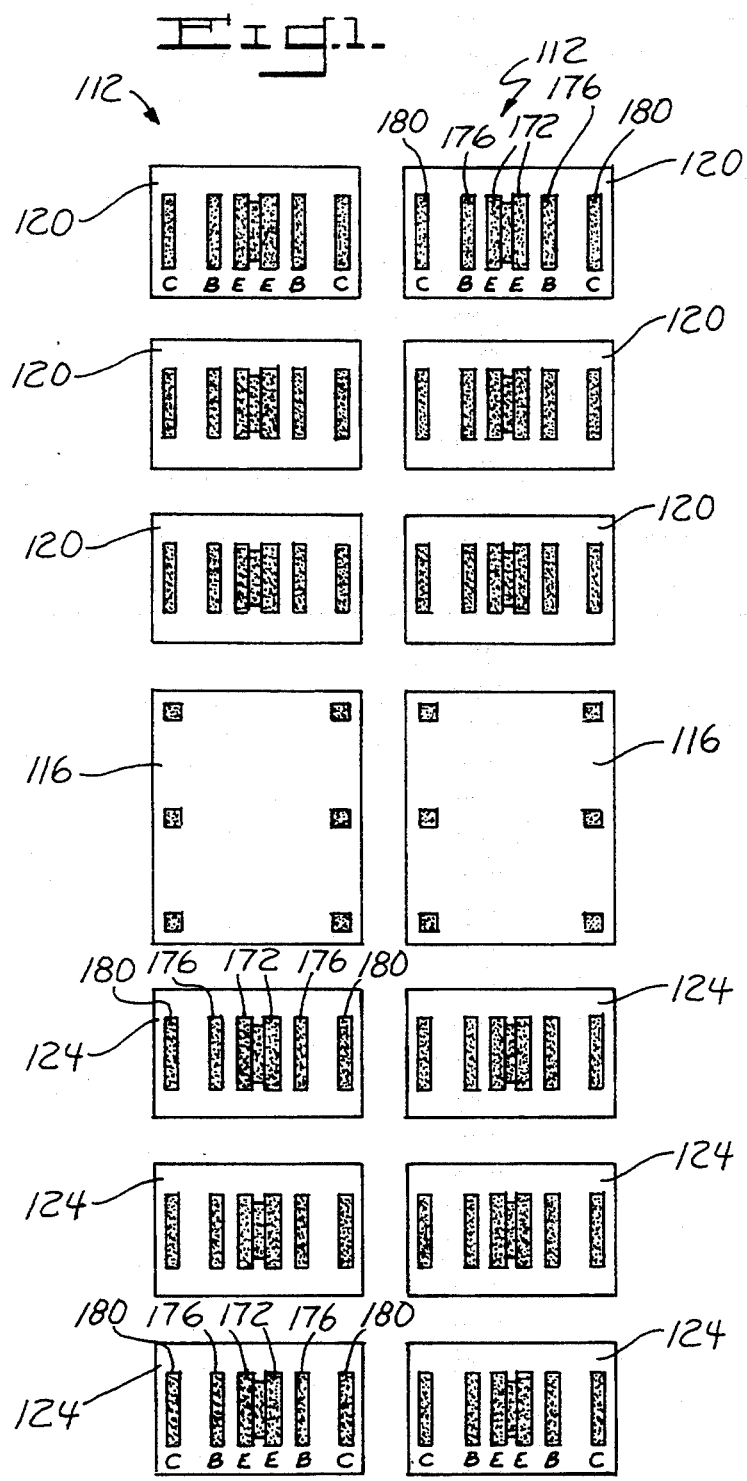
FIG. 1 is a plan view of two identical primitives or cells that each include several identical PNP and NPN transistors and a capacitor in accordance with the continuous column architecture of the present invention.

Referring to the drawings in detail, a preferred embodiment of a linear, bipolar-type ASIC having an array architecture comprised of a plurality of continuous columns of cells is illustrated and generally designated by the reference numeral 100. In the preferred embodiment, the ASIC 100 comprises a silicon semiconductor substrate 104 having formed therein four columns 108 of a plurality of cells 112. Each cell 112 comprises a centrally-located capacitor 116, flanked on one side by three identical PNP transistors 120, and flanked on the opposite side by three identical NPN transistors 124. Disposed around the outer periphery of the substrate 104 are bond pads 128 for external connection to and from the ASIC substrate 104. Disposed between the bond pads 128 and the cell columns 108, and also between pairs of cell columns 108, are open field areas 132. Thin film resistors 136, along with power planes 140, 144, are formed in these open field areas 132. Ground planes 148 are located in proximity to the capacitors 116. The cells 112 are "personalized" in that they are connected into desired circuit configurations, such as a current mirror 152, through connection of cell elements 116, 120, 124, resistors 136, and bond pads 128 through use of double-level metallizations 156, 160, vias 164 and contacts 168.

Referring now to FIG. 1, there illustrated are two identical cells 112 that are arranged in columns 108. Each cell 112 comprises a centrally-located one picofarad ("1pf") capacitor 116. On one side of the capacitor 116 are formed three identical bipolar PNP transistors 120, each transistor 120 having two emitters 172, two bases 176 and two collectors 180. Disposed on the opposite side of the capacitor 116 are three identical bipolar NPN transistors 124. Each NPN transistor 124 also comprises, in a similar manner, two emitters 172, two bases 176 and two collectors 180. The transistors 120, 124 are precision, high-voltage, complementary bipolar devices. Although not required for the broadest scope of the present invention, the preferred embodiment utilizes dual-element transistors 120, 124 (that is, two emitters 172, two collectors 180, two bases 176) to minimize parasitic resistance associated with the transistor, thereby allowing for higher frequency device operation. Further, the dual-element design allows for lower noise and increased analog current capacity. However, as will be seen hereinafter in greater detail with respect to an exemplary embodiment of a bi-directional current mirror 152 implemented from the array cells 112 of FIG. 1, the dual-element design requires additional metallizations for connections therebetween.

Figure 2:
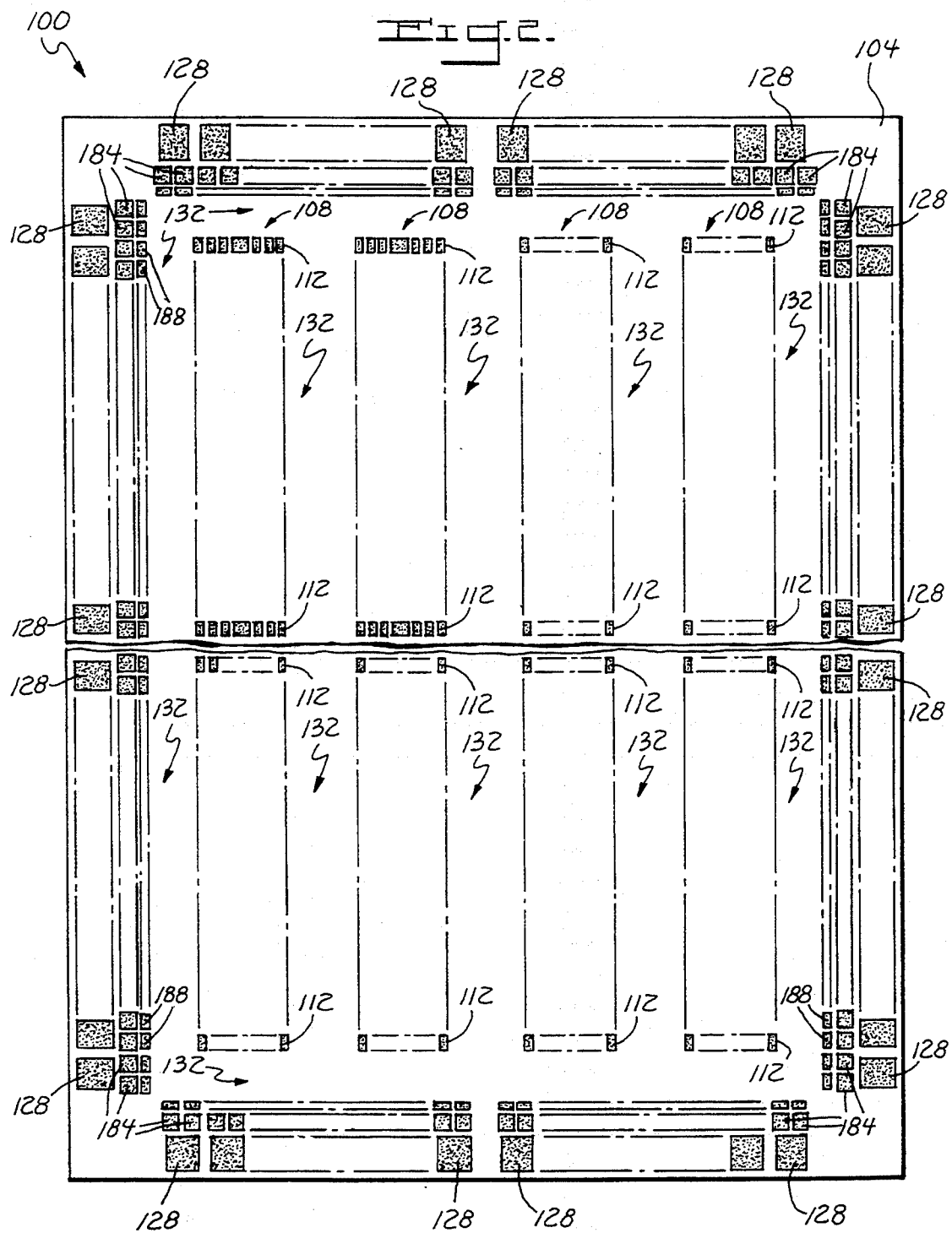
FIG. 2 is a plan view of a substrate of an entire linear array fabricated with a plurality of columns, each column containing a plurality of the cells of FIG. 1, the cells being arranged in accordance with another aspect of the present invention.

FIG. 2 illustrates a plan view of the semiconductor substrate 104 of an entire linear, bipolar-type ASIC 100 having four columns 108, each column 108 comprised of sixty identical cells 112, similar to the two cells 112 illustrated in FIG. 1. It can be seen from FIG. 2 that the major geometrical axis of each column 108 is perpendicular to the major geometrical axis of each cell 112. Thus, a total of two hundred forty cells 112 exist on the ASIC 100 of FIG. 2. This further translates into two hundred forty (240) 1pf capacitors 116, and seven hundred twenty (720) of each of the NPN and PNP identical complementary bipolar transistors 120, 124. Disposed around the periphery of the silicon substrate 104 are approximately eighty-eight (88) bond pads 128 that are used to connect certain ones of the resulting circuits formed among the cells 112 to external pins (not shown) on the overall ASIC external package. Associated with each bond pad 128 are a pair of electrostatic discharge ("ESD") protection devices 184, such as diodes, that protect the internal ASIC circuits connected to the corresponding bond pad 128 from a possibly ruinous high voltage applied thereto. Associated with each ESD protection device 184 is a support transistor 188 that functions much like a silicon-controlled rectifier ("SCR") to establish a voltage to clamp the bond pad 128 to zero volts.

As can be seen in FIG. 2, open field areas 132 exist on the semiconductor substrate 104 between the perimeter of the columns 108 and also between the columns 108 and the bond pads 128 and associated circuitry 184, 188. As will be seen in greater detail hereinafter with respect to an exemplary embodiment of a bi-directional current mirror 152, these open field areas 132 facilitate the placement of thin film resistors 136. This open field area approach provides for a finite selection of both absolute and ratio metric resistor values and accuracy. It also allows for optional laser trimming of the resistors 136 to achieve resulting very high performance transistor-based circuitry. It has been demonstrated empirically that the thin film resistors 136 utilized in conjunction with the array architecture approach of the present invention have achieved characteristics such as one thousand ohms per square, a temperature coefficient equal to one hundred ppm/C and 0.01 percent matching.

Figure 3:
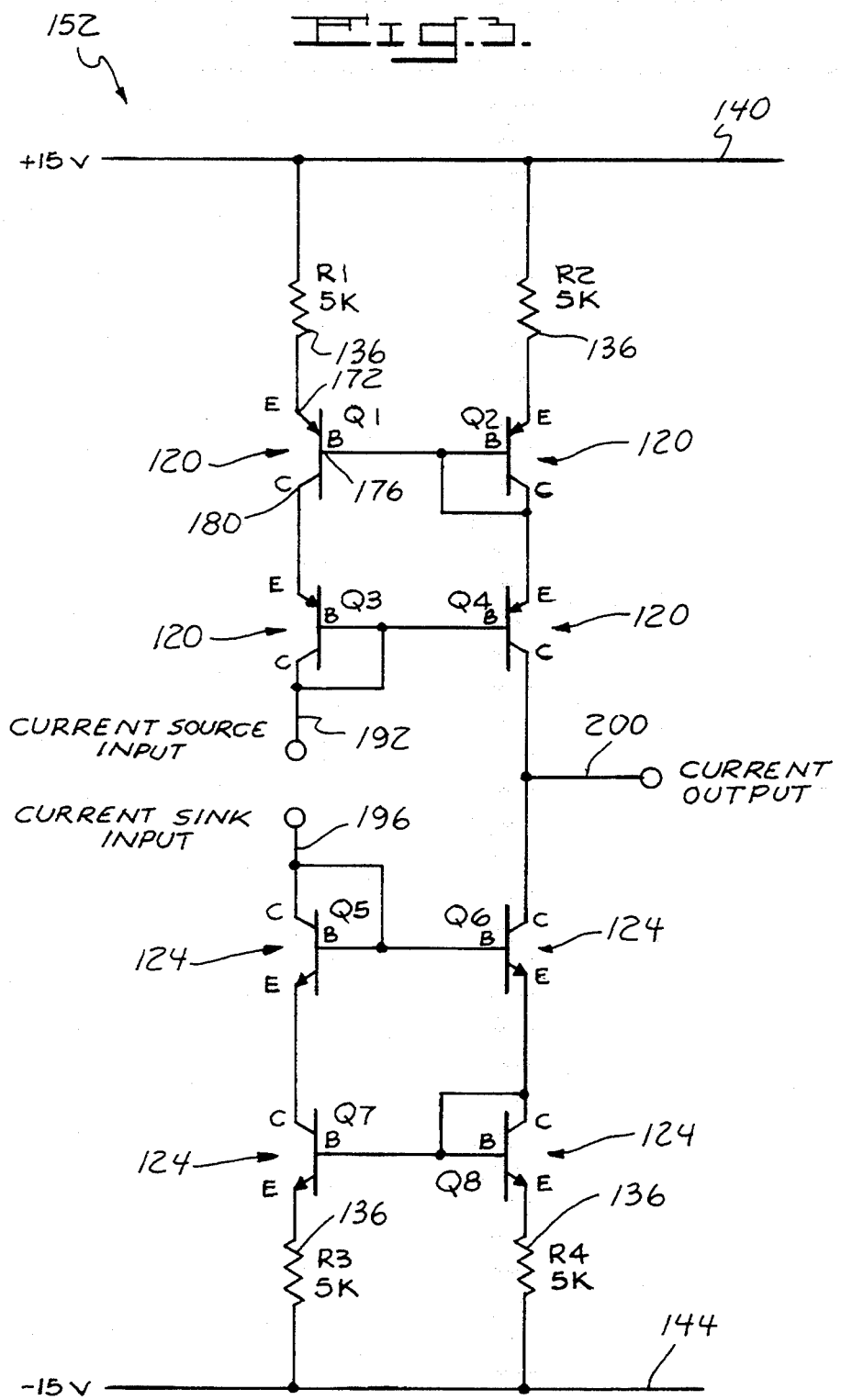
FIG. 3 is a schematic diagram of a bi-directional current mirror circuit.

Referring now to FIG. 3, there illustrated is a schematic diagram of a known bi-directional current mirror circuit 152. The current mirror comprises eight transistors, $Q_1$-$Q_8$ 120, 124, together with four resistors, $R_1$-$R_4$ 136. The current mirror 152 includes two inputs: an output sourcing input 192, and an output sinking input 196. The current mirror 152 also includes a single output 200, which can either source or sink current. One or more of these inputs 192, 196 or output 200 may, if desired, be connected by the appropriate metallizations 156, 160 to corresponding bond pads 128. The current mirror is connected between positive and negative fifteen-volt planes 140, 144 (+15 v, −15 v). The emitter 172, base 176 and collector 180 of each transistor are indicated on FIG. 3 by "E", "B", and "C", respectively.

Figure 4:
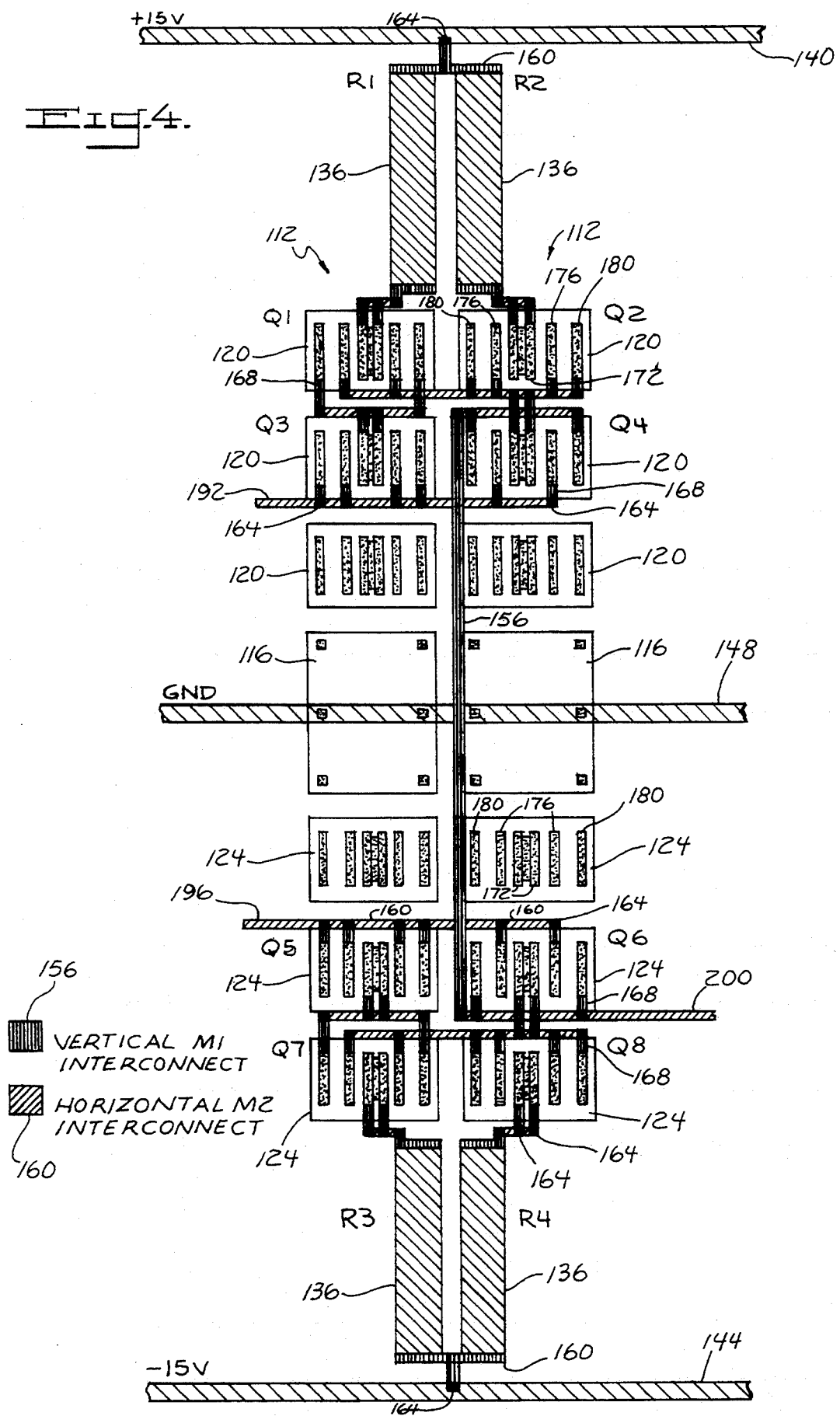
FIG. 4 is a plan view of the two cells of FIG. 1 connected to form the bi-directional current mirror of FIG. 3.

Referring now to FIG. 4, there illustrated is a plan view of the two array cells 112 of FIG. 1 connected with appropriate dual-level metallizations 156, 160, vias 164 and contacts 168 to achieve the bi-directional current mirror 152 of FIG. 3. Illustrated on the top of FIG. 4 is a +15 v plane 140, while illustrated on the bottom of FIG. 4 is a −15 v plane 144. These two voltage planes 140, 144 run parallel to the major axis of the corresponding column 108 of cells 112 that contain the two cells comprising the current mirror 152 of FIG. 4. However, if desired, the voltage planes 140, 144 may run adjacent to the substrate 104 in the vicinity of the transistors 120, 124. Also illustrated is a ground plane 148 that runs parallel to the two voltage planes 140, 144 and also adjacent to, and in proximity to the capacitor 116 in the center of each cell 112. The voltage and ground planes 140 –148 may each comprise an aluminum metallization. Also included in the open field areas 132 on either side of the two cells 112 are the corresponding four 5 kilo-ohm ("5 k") resistors, $R_1$-$R_4$ 136. These thin film resistors 136 are deposited by known means, such as vacuum deposition, and comprise, for example, silicon chromium material.

The labels for the transistors 120, 124 of FIG. 3, $Q_1$-$Q_8$, together with the labeling for the resistors 136 of FIG. 3, $R_1$-$R_4$, are transposed onto FIG. 4 for better understanding of the arrangement of the current mirror circuit 152 thereon. The electrical connections between all of the components formed on the silicon substrate 104 are carried out through a dual-level aluminum metallization scheme, together with vias 164 and contacts 168. These two levels of metallizations 156, 160 are referred to as M1 and M2 interconnects. The M1 interconnects 156 run vertically on the drawing page of FIG. 4, while the M2 interconnects 160 run horizontally on the drawing page of FIG. 4. Variations are with respect to the connections at the top and bottom of each resistor, $R_1$-$R_4$ 136. These "horizontal" connections are made with M1 instead of M2 interconnects.

The fabrication of the cell components in the semiconductor substrate 104 can be carried out by any type of known linear bipolar fabrication process. Further, the fabrication of the thin film resistors 136 and interconnects above the semiconductor substrate can also be carried out by known means and methodologies. In the exemplary embodiment, the metallization layer M1 156 is disposed closest to the silicon substrate 104 in which the complementary bipolar PNP and NPN transistors 120, 124 and capacitors 116 are formed, and is separated therefrom by an insulating layer (not shown) of, e.g., silicon dioxide. Disposed on top of the M1 metallization layer 156 is a second layer of insulation (not shown), such as silicon dioxide, that is deposited using known methodologies to a thickness of a few hundred angstroms. On top of the silicon dioxide is disposed the second metallization layer 160, M2, which is disposed, in a similar manner as M1, to a thickness of 1 micron. A final passivation coating (not shown) layer may be disposed on top of the M2 metallization layer 160. Any necessary electrical connections between the M1 and M2 metallization layers 156, 160 are achieved by vertically-oriented vias 164 that are formed through the second silicon dioxide insulating layer disposed between the two metallization layers 156, 160. Further, connections between the M1 layer and terminals of components formed in the silicon substrate 104 are achieved by vertically-oriented contacts 168 formed through the first silicon dioxide insulating layer.

The interconnection of the elements of FIG. 4 can be seen to follow the schematic diagram of the bi-directional current mirror 152 of FIG. 3. For ease in understanding, reference should also be made to FIG. 1 for an indication of the respective collector 180, base 176 and emitter 172 terminals of each identical transistor, $Q_1$-$Q_8$ 120, 124. As a general design rule, neither of the metallizations 156, 160 should cross the substrate 104 of any of the transistors 120, 124. When a connection is required between either the silicon substrate 104 and the vertical M1 metallization 156, or between the M1 metallization 156 and the M2 metallization 160, a contact 168 or via 164, respectively, is used to effect such a connection. A via 164 and contact 168 are types of electrical connections formed from the same material as that of either the M1 or M2 metallizations 156, 160; that is, aluminum. Note in the resulting connection of the current mirror 152 that two transistors 120, 124 of each cell 112 are unused. However, due to the generous amount of spacing in the open field areas 132, and in the spacing between cells 112 and components of each cell, these unused transistors 120, 124 may be utilized in other circuits (not shown) formed in the array. In this way, 100 percent of the transistors 120, 124 may be utilized.

In the preferred embodiment of the linear, bipolar-type ASIC 100 of the present invention, the array architecture of components fabricated in the semiconductor substrate 104 is implemented with a linear bipolar process, such as that referred to as the ACUTE process developed by United Technologies Corporation, the assignee of the present invention. The ACUTE process is a high-voltage, analog bipolar process that features a bond and etch-back, silicon-on-insulator ("BESOI")/trench/LOCOS isolation process. Some features of the ACUTE technology include twin buried layers, twin wells, a single level of silicided polysilicon for N+ and P+ polysilicon emitters, two levels of interconnect, and laser-trimmable thin film silicon chromium resistors. The buried layers and sinks reduce collector resistance, while the precise epi and P-well thickness and doping control achieve breakdown voltages greater than 35 volts. The ACUTE process achieves full dielectric isolation between devices using trenched devices on SOI substrates. The trench isolation has LOCOS caps, along with 1.2 micron high-speed salicided complementary polysilicon emitter NPN and PNP bipolar transistors. For further information on the ACUTE process, see "The Effect of Trench Processing Conditions on Complementary Bipolar Analog Devices with SOI/Trench Isolation" Jerome R. et al, *IEEE* 1993 Bipolar Circuits and Technology Meeting 3.2, pages 41–44 (1993); or "ACUTE" A High-Performance Analog Complementary Polysilicon Emitter Bipolar Technology Utilizing SOI/Trench Full Dielectric Isolation", Jerome, R. C. et al., *IEEE International SOI Conference*, pages 100–101(1993), these papers being hereby incorporated by reference. However, it is to be understood that any other type of linear bipolar process may be used for fabricating the underlying structure of the array architecture of the present invention.

The column array architecture of the present invention has been described in an exemplary embodiment for use in implementing a bi-directional current mirror 152. However, it is to be understood that other types of analog circuits, either known or hereinafter contemplated, may be fabricated on the linear ASIC 100 of the present invention using ordinary skill of the art, in light of the teachings herein. For example, circuits such as voltage references, oscillators, logic level shifters, current switches, or reference current sources may be implemented. Further, each identical NPN and PNP transistor 120, 124 within each cell 112 has been described as having two bases 176, two emitters 172, and two collectors 180. However, it is to be understood that this is purely exemplary; transistors having different numbers of bases, emitters, and/or collectors may be utilized without departing from the broadest scope of the present invention. Further, each cell 112 has been described as having a capacitor 116 located between the two types of transistors. Again, however, this is purely exemplary. No capacitor need be formed between the two types of transistors, if desired.

It should be understood by those skilled in the art that obvious structural modifications can be made without departing from the spirit of the invention. Accordingly, reference should be made primarily to the accompanying claims, rather than the foregoing specification, to determine the scope of the invention.

Having thus described the invention, what is claimed is:

1. An integrated circuit, comprising:
   a. a semiconductor substrate;
   b. at least one column of a plurality of cells formed in the semiconductor substrate, each cell in the column including at least one pair of complimentary bi-polar PNP and NPN transistors, each transistor having at least one emitter terminal, at least one base terminal and at least one collector terminal, and wherein each cell further includes a capacitor disposed between innermost ones of the at least one NPN transistor and the at least one PNP transistor; and
   c. a first power plane disposed adjacent to one or more of the PNP transistors and extending at least the entire length of the column, a second power plane disposed adjacent to one or more of the NPN transistors and extending at least the entire length of the column.

2. The integrated circuit of claim 1, wherein each cell includes two or more PNP transistors and two or more NPN transistors, all of the PNP transistors being disposed adjacent to each other, all of the NPN transistors being disposed adjacent to each other.

3. The integrated circuit of claim 1, further comprising a third power plane disposed adjacent to the capacitor, the third power plane extending at least the entire length of the column.

4. The integrated circuit of claim 3, wherein the third power plane is a ground plane, and further including means for selectively connecting the capacitor to the ground plane and for selectively connecting the capacitor to certain predetermined terminals of the transistors in any of the cells.

5. The integrated circuit of claim 1, further comprising a third power plane disposed between innermost ones of the NPN and PNP transistors.

6. The integrated circuit of claim 1, wherein each PNP and each NPN transistor has two emitter terminals, two base terminals and two collector terminals.

7. The integrated circuit of claim 1, further comprising means for selectively interconnecting among certain predetermined terminals of the transistors and the first and second power planes to form predetermined electrical circuits.

8. The integrated circuit of claim 1, further comprising one or more resistors selectively formed adjacent to the transistors.

9. The integrated circuit of claim 8, further comprising means for selectively interconnecting among certain predetermined terminals of the transistors, the first and second power planes, and the resistors to form predetermined electrical circuits.

10. The integrated circuit of claim 1, further comprising a plurality of bond pads disposed on the semiconductor substrate at the periphery thereof.

11. The integrated circuit of claim 10, further comprising means for selectively connecting selected ones of the bond pads to selected predetermined terminals of the transistors.

12. A linear, bipolar-type, application specific integrated circuit, comprising:
   a. a silicon substrate;
   b. four columns, each column containing a plurality of cells, each cell including two or more pairs of complimentary bipolar PNP and NPN transistors formed in the silicon substrate, all of the NPN transistors in the cell being disposed adjacent to each other, all of the PNP transistors in the cell being disposed adjacent to each other, each cell further including a capacitor having multiple terminals, the capacitor being disposed between innermost ones of the NPN and PNP transistors; and c. a first power plane disposed adjacent to and spaced apart from an outermost one of the PNP transistors defining a first open field area therebetween, the first power plane extending at least the entire length of the column of cells to which it is adjacent to, a second power plane disposed adjacent to and spaced apart from an outermost one of the NPN transistors defining a second open field area therebetween, the second power plane extending at least the entire length of the column of which the second power plane is adjacent to.

13. The application specific integrated circuit of claim 12, further comprising a third power plane disposed adjacent to the capacitor, the third power plane extending at least the entire length of the column of cells containing the capacitors to which the third power plane is adjacent.

14. The application specific integrated circuit of claim 12, wherein each PNP and each NPN transistor has two emitter terminals, two base terminals, and two collector terminals.

15. The application specific integrated circuit of claim 14, further comprising means for selectively interconnecting among certain predetermined terminals of the PNP and the NPN transistors, the first and second power planes, and the capacitors to form predetermined electrical circuits.

16. The application specific integrated circuit of claim 12, further comprising one or more resistors selectively formed in certain predetermined locations in the open field areas.

17. The application specific integrated circuit of claim 16, further comprising means for selectively interconnecting among certain transistors, the resistors, the capacitors, and the first and second power planes to form predetermined electrical circuits.

18. An application specific integrated circuit, comprising:

a. a semiconductor substrate having a plurality of cells formed therein, each cell including at least one bipolar NPN transistor and at least one bipolar PNP transistor, the plurality of cells being arranged in at least one column, the semiconductor substrate further includes open field areas adjacent to one of the at least one bipolar PNP transistor and adjacent to one of the at least one bipolar NPN transistor, one or more resistors being disposed in certain predetermined locations in the open field areas, each of the PNP and NPN transistors having at least one emitter terminal, at least one base terminal, and at least one collector terminal, each cell also including a capacitor having multiple terminals and being disposed between innermost ones of the at least one NPN transistor and the at least one PNP transistor;

b. a first power plane disposed adjacent to and spaced apart from an outermost one of the at least one PNP transistor, an open field area being disposed therebetween, the first power plane extending at least the entire length one of the at least one of column of cells;

c. a second power plane disposed adjacent to and spaced apart from an outermost one of the at least one NPN transistors, an open field area being disposed therebetween, the second power plane extending at least the entire length of said pne of at least one column of cells;

d. a third power plane disposed adjacent to the capacitors of the cells, the third power plane extending at least the entire length of the column of cells; and e. means for selectively interconnecting among certain predetermined terminals of the transistors, the capacitors, the power planes, and the resistors to form predetermined electrical circuits.

19. The application specific integrated circuit of claim 18, wherein each NPN transistor and each PNP transistor contains at least two emitter terminals, at least two base terminals, and at least two collector terminals.

* * * * *